United States Patent
Hanneman

[11] Patent Number: 6,018,302
[45] Date of Patent: Jan. 25, 2000

[54] MECHANICAL POINTER DRIVE FOR AVIONICS DISPLAY

[75] Inventor: Charles K. Hanneman, Overland Park, Kans.

[73] Assignee: AlliedSignal Inc., Norristown, N.J.

[21] Appl. No.: 08/708,478

[22] Filed: Sep. 5, 1996

[51] Int. Cl.[7] .................................................. G01C 21/00
[52] U.S. Cl. ...................... 340/971; 324/160; 324/175; 116/284; 701/215; 701/14; 701/213; 342/357; 342/359; 33/363 R; 33/320; 364/565; 364/566; 364/559
[58] Field of Search .................................. 340/974, 971, 340/977, 975, 976, 978, 979; 701/215, 224, 14, 213; 342/357, 359; 33/363 R, 320; 364/566, 565, 559; 324/166, 173, 175, 160; 116/284

[56] References Cited

U.S. PATENT DOCUMENTS

| | | | |
|---|---|---|---|
| 3,639,747 | 2/1972 | Schmidt | 362/26 |
| 3,921,305 | 11/1975 | King, Jr. et al. | 33/317 D |
| 4,067,007 | 1/1978 | Bryden | 341/114 |
| 4,227,150 | 10/1980 | Widl | 324/175 |
| 4,319,333 | 3/1982 | Hedrick | 364/565 |
| 4,800,501 | 1/1989 | Kinsky | 701/220 |
| 4,939,675 | 7/1990 | Luitje | 364/550 |
| 5,189,430 | 2/1993 | Yano et al. | 342/457 |
| 5,259,333 | 11/1993 | Iino | 116/286 |
| 5,341,681 | 8/1994 | Molny | 73/382 G |
| 5,617,317 | 4/1997 | Ignagni | 701/215 |

Primary Examiner—Benjamin C. Lee

[57] ABSTRACT

An avionics display (10) for use in an aircraft navigation system including a navigation receiver. The avionics display (10) includes a needle (12) for indicating the position, heading, glide slope or other navigational parameter of the aircraft and a stepper motor (14) coupled with the needle and responsive to the navigation receiver for driving the needle in response to the navigation signals received by the receiver. The stepper motor drives the needle at a much higher torque than prior art displays and is therefore less sensitive to contaminates and magnetic interference and is less fragile.

14 Claims, 1 Drawing Sheet

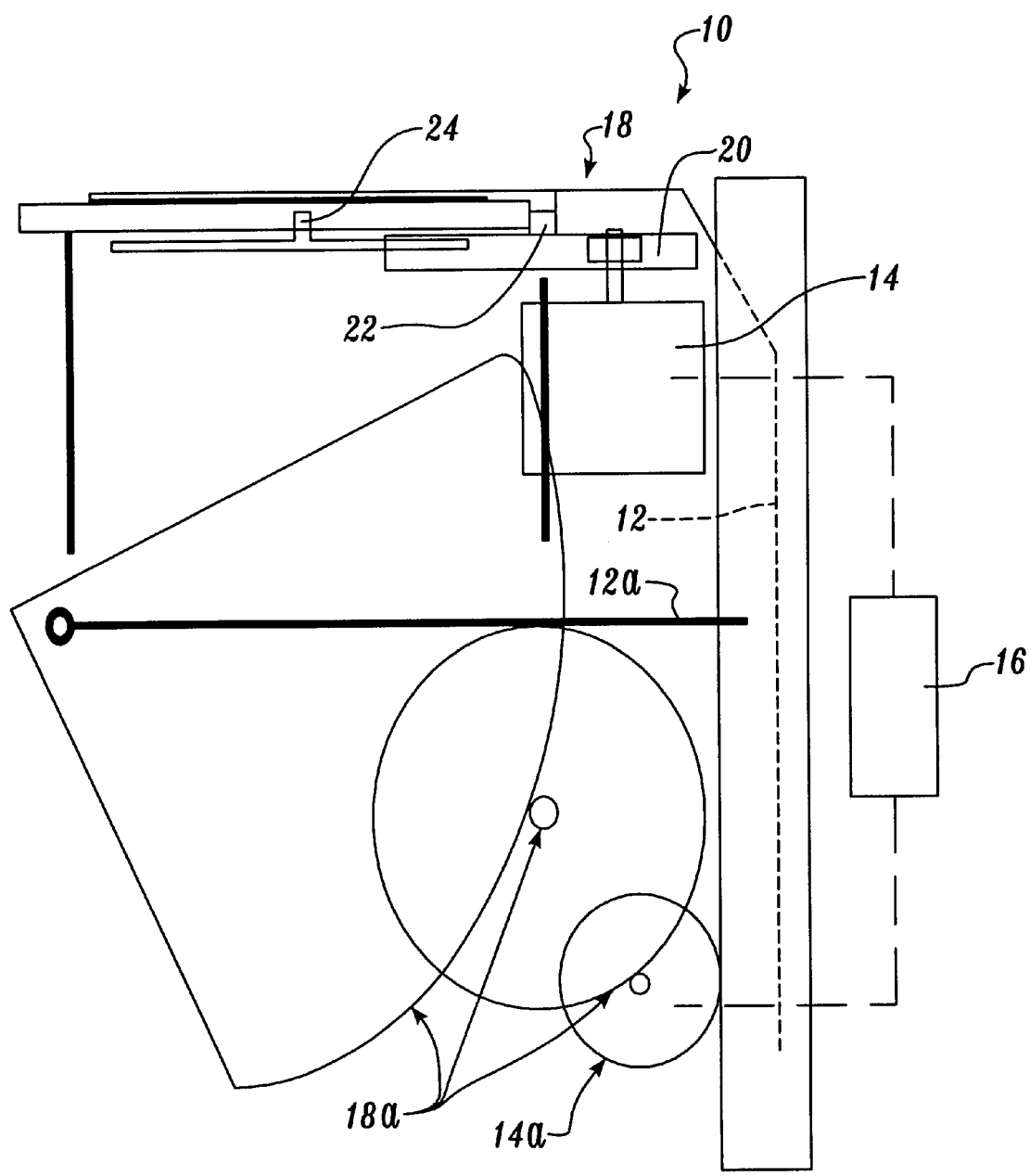

MECHANICAL POINTER DRIVE FOR AVIONICS DISPLAY

RELATED APPLICATION

This application claims priority under 35 U.S.C. Section 119(e) of Provisional Application Ser. No. 60/022,486, filed Jul. 5, 1996, entitled MECHANICAL POINTER DRIVING AND SENSING TECHNIQUES FOR MECHANICAL DISPLAYS.

BACKGROUND OF THE INVENTION

1. Field of the Invention

The present invention relates to navigation displays for use in aircraft navigation systems. More particularly, the invention relates to a navigation display that is driven by a stepper motor and a gear reduction mechanism.

2. Description of the Prior Art

Prior art avionics displays are typically driven by D'Arsonval movement. These types of displays include a pointer or needle attached to a coil of wire that is moveably positioned within the field of a permanent magnet.

Signals representative of a navigational parameter of the aircraft such as the position, heading, or glide slope of the aircraft are delivered to the coil. The signals set up a magnetic field around the coil and cause a torque to appear between the magnetic field of the magnet and the magnetic field of the coil. The torque moves the needle a distance proportional to the navigation signals to indicate the position, heading, glide slope or other navigational parameter of the aircraft.

Unfortunately, these prior art displays are extremely sensitive to contaminates because their magnets attract metallic and magnetic debris. The attracted contaminants interfere with the movement of the needles of the displays and therefore often cause erratic performance of the displays.

Contaminates can often completely prevent movement of the needles of D'Arsonval type displays because these types of displays generate very low torque to drive their needles. Thus, the displays and the aircraft in which the displays are used must be kept extremely clean to prevent malfunction of the displays.

Another disadvantage of D'Arsonval type displays is that since their needles are driven at such a low torque, they are very fragile and must be precisely aligned to maintain proper mechanical clearances between their moving coils, needles and surrounding mechanical structures. Thus, these displays must be precisely adjusted and maintained.

SUMMARY OF THE INVENTION

The present invention solves the above-described problems and provides a distinct advance in the art of avionics displays. More particularly, the present invention provides an avionics display that is less sensitive to contaminates, less fragile, and is more easy to align and maintain.

The avionics display of the present invention is configured for use in an aircraft navigation system including a navigation receiver operable for receiving navigation signals from navigation transmitters. The preferred display broadly includes an indicator such as a navigation needle and a stepper motor coupled with the indicator and responsive to the navigation receiver for driving the indicator in response to the navigation signals.

The stepper motor drives the indicator at a much higher torque than D'Arsonval-type displays. Therefore, the display of the present invention is much less sensitive to contaminates than prior art displays. Moreover, the display is less fragile and can be more easily aligned and maintained.

In preferred forms, the avionics display of the present invention also includes a gear reduction mechanism coupled between the stepper motor and the indicator. The gear reduction mechanism further increases the torque exerted on the indicator and therefore further decreases the sensitivity of the display to contaminates. The gear reduction mechanism also permits the stepper motor to drive the indicator at a rate that appears to be continuous or analog and that is therefore visually acceptable to pilots accustomed to analog displays.

BRIEF DESCRIPTION OF THE DRAWING FIGURE

The drawing figure is a schematic diagram of an avionics navigation display constructed in accordance with a preferred embodiment of the present invention.

DETAILED DESCRIPTION OF A PREFERRED EMBODIMENT

Avionics navigation display 10 of the present invention is configured for use in a conventional navigation system of an aircraft and is operable for displaying the position, heading, glide slope or other navigational parameter of the aircraft. As illustrated, display 10 broadly includes a conventional display including indicia representative of a navigational parameter of the aircraft, an indicator such as needle 12, stepper motor 14, microprocessor 16, and gear reduction mechanism 18. The components of display 10 are preferably housed within a plastic or other non-magnetic enclosure similar to conventional displays.

Display 10 can be used in any conventional navigation system having a navigation receiver such as, for example, a VHF Omninavigation Receiver (VOR) system, an Automatic Direction Finder (ADF) system, or an Omni Bearing Selector (OBS) system. The navigation receiver of the navigation system is operable for receiving navigation signals from navigation transmitters.

In more detail, needle 12 is a conventional VOR, GPS, LORAN, or Localizer needle shiftably mounted within the display for indicating the navigational parameter of the aircraft. Display 10 may also include additional indicators or needles such as glide slope needle 12a for indicating the landing angle of the aircraft. Each needle 12,12a includes a drive axle for moving the needle across display 10.

Stepper motor 14 is operably coupled with needle 12 by gear reduction mechanism 18 and is electrically coupled with microprocessor 16. Stepper motor 14 drives needle 12 in response to navigation signals received from microprocessor 16 as described below. An example of a stepper motor that may be used in the present invention is the Model No. 148-05053-0000 stepper motor manufactured by Allied Signal Avionics, Inc. of Olathe, Kans.

Display 10 preferably includes an additional stepper motor 14a operably coupled with needle 12a by gear reduction mechanism 18a. Each stepper motor 14,14a includes a drive shaft that rotates in response to the receipt of navigation signals from microprocessor 16.

In a preferred embodiment, stepper motors 14,14a have an approximate 18 degree step and a step rate of approximately 400 Hz. As described below, this ensures that stepper motors 14,14a drive needles 12,12a at a rate that is visually acceptable.

Stepper motors 14,14a are preferably enclosed within magnetic enclosures such as those made from Mu metal to attenuate the motors' associated magnetic fields. This reduces or eliminates any attraction of magnetic debris to display 10.

Microprocessor 16 is coupled between the navigation receiver of the navigation system and stepper motors 14,14a for driving the stepper motors in response to the navigation signals received from the navigation receiver. Each stepper motor 14,14a and microprocessor 16 cooperatively shift their respective needle 12,12a across the display in response to the navigation signals. Microprocessor 16 may be any conventional microprocessor such as a Model No. MC68HC05B6 device manufactured by Motorola, Inc.

Gear reduction mechanism 18 is coupled between needle 12 and stepper motor 14 for reducing the rotational speed of the needle drive axle relative to the speed of the stepper motor drive shaft. Display 10 also preferably includes gear reduction mechanism 18a coupled between needle 12a and stepper motor 14a.

To provide a needle movement that appears to be continuous or analog, stepper motors 14, 14a and gear reduction mechanisms 18,18a are preferably configured to provide a minimum discernable movement of needles 12, 12a less than or equal to 0.5% of the scale of display 10. To this end, gear reduction mechanisms 18, 18a preferably provide an approximate 160–200:1 gear reduction between stepper motors 14, 14a and needles 12, 12a. This provides a needle step-size of about 0.004" when stepper motors 14, 14a are in full-step mode and a lesser needle step-size when stepper motors 14, 14a are in half-step or micro-step mode.

Such a step-size allows stepper motors 14,14a to drive needles 12, 12a at a rate sufficient to satisfy a one second time constant responding to a twenty degree step. However, those skilled in the art will appreciate that the gear reduction of mechanisms 18, 18a may be selected to provide any visually acceptable step-size.

Each gear reduction mechanism 18, 18a preferably includes a plurality of circular gears coupled between the drive shaft of its stepper motor 14, 14a and the drive axle of its needle 12, 12a. For example, as illustrated, gear reduction mechanism 18 may include gears 20 which provides a 3:1 gear reduction, gears 22 which provides a 11:1 gear reduction and gears 24 which provides a 11:1 gear reduction. Alternatively, gear reduction mechanism 18 may include two stages of gears each providing a 14:1 gear reduction.

Display 10 also preferably includes a flag controlled by microprocessor 16. Microprocessor 16 displays the flag whenever it is disconnected from power or the navigation information is not valid to alert the pilot of an unusable display.

Display 10 may also be coupled with other magnetically sensitive instruments such as a conventional magnetic compass card and an Omni Bearing Selector (OBS) knob. The compass card or other magnetically sensitive instrument may be driven by a stepper motor that is controlled by the OBS knob. The response time of the stepper motor is selected to give the appearance that the magnetic compass part is mechanically connected to the OBS knob.

In operation, the navigation receiver of the navigation system receives navigation signals. Microprocessor 16 receives these signals and directs stepper motors, 14,14a to rotate a distance proportional to the signals. The rotational movement of stepper motors 14,14a is transferred to needles 12,12a by gear reduction mechanisms 18,18a. This permits display 10 to display the position, heading, glide slope or other navigational parameter of the aircraft.

Stepper motors 14,14a drive needles 12,12a at a much higher torque than D'Arsonval-type displays. Therefore, display 10 is much less sensitive to contaminates and magnetic interference than prior art displays. Moreover, display 10 is less fragile and easier to align and maintain than prior art displays due to the higher torque of stepper motors 14,14a. Gear reduction mechanisms 18,18a further increase the torque delivered to needles 12,12a by stepper motor 14,14a and thus further increase the accuracy and ruggedness of display 10.

In an alternative embodiment of the invention, gear reduction mechanisms 18, 18a may be replaced with "radio fish string" or "dial string" mechanisms. The dial string mechanisms are wrapped around the drive shafts of stepper motors 14, 14a and the drive axles of needles 12, 12a. The dial string mechanisms are smaller than gear reduction mechanisms 18, 18a and thus permit display 10 to be used in smaller applications.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

1. An aircraft navigation display for use in an aircraft navigation system including a navigation receiver operable for receiving navigation signals from navigation transmitters, said navigation display comprising:

a display comprising indicia representative of a navigational parameter of the aircraft;

an indicia indicator shiftable relative to said display;

shifting means for shifting said indicator in response to the navigation signals, said shifting means comprising a stepper motor coupled with said indicator for shifting said indicator relative to said display in response to the navigation signals to indicate the navigational parameter of the aircraft represented by the navigation signals; and, wherein said stepper motor comprises a drive shaft for coupling with a indicator drive axle, said navigation display further comprising gear reduction means coupled between said stepper motor and said indicator drive axle for reducing the rotational speed of said drive axle relative to said drive shaft for increasing the torque delivered to said indicia indicator via said drive axle by said stepper motor; and a dial string mechanism coupled between said stepper motor and said indicator.

2. The navigation display as set forth in claim 1, said shifting means further comprising processor means coupled between said stepper motor and the navigation receiver for receiving the navigation signals and driving said stepper motor in response thereto.

3. The navigation display as set forth in claim 2, said processor means including a microprocessor.

4. The display of claim 2, comprising a plurality of indicia indicative of a plurality of navigation parameters and further comprising a microprocessor having an input coupled to receive a plurality of navigation signals and an output coupled to said stepper motor for driving said stepper motor in response to said navigation signals.

5. The navigation display as set forth in claim 2, said gear reduction means including a plurality of gears coupled between said drive shaft and said drive axle.

6. The navigation display as set forth in claim 5, said gears being configured for providing a 160:1 gear reduction between said drive shaft and said drive axle.

7. The navigation display as set forth in claim 5, said gears being configured for providing a 200:1 gear reduction between said drive shaft and said drive axle.

8. The navigation display as set forth in claim 1, said indicator including a navigation needle.

9. The navigation display as set forth in claim 1, said navigational parameter being selected from the group consisting of the position of the aircraft relative to the navigation transmitters, the heading of the aircraft, the glide slope of the aircraft, and the altitude of the aircraft relative to the navigation transmitters.

10. The navigation display as set forth in claim 1, said display, comprising a plurality of sets of indicia representative of a plurality of navigational parameters of the aircraft.

11. The display of claim 1, wherein the aircraft navigation display further comprises a second indicator and the shifting means further comprises a second motor coupled to the second indicator for shifting said second indicator relative to said display in response to the navigation signals to indicate a second navigational parameter of the aircraft represented by the navigation signals; and, wherein said second stepper motor comprises a drive shaft for coupling with a second indicator drive axle, said navigation display further comprising gear reduction means coupled between said second stepper motor and said second indicator drive axle for reducing the rotational speed of said drive axle relative to said drive shaft for increasing the torque delivered to said second indicator via said drive axle by said second stepper motor.

12. An aircraft navigation apparatus comprising:
   a navigation receiver operable for receiving navigation signals from navigation transmitters; and
   a navigation display coupled with said navigation receiver, said navigation display comprising:
      a display comprising indicia representative of a navigational parameter of the aircraft;
      an indicia indicator shiftable relative to said display;
      shifting means for shifting said indicator in response to the navigation signals, said shifting means comprising a stepper motor coupled with said indicator for shifting said indicator relative to said display in response to the navigation signals to indicate the navigational parameter of the aircraft represented by the navigation signals; and, wherein said stepper motors each comprises a drive shaft and for coupling with a drive axle, said display further comprising gear reduction means coupled between said stepper motor and said indicator for reducing the rotational speed of said drive axle relative to said drive shaft for increasing the torque delivered to said indicator by said stepper motor via said drive axle; and
      a dial string mechanism coupled between said stepper motor and said indicator.

13. The apparatus as set forth in claim 12, said shifting means further comprising processor means coupled between said stepper motor and said navigation receiver for receiving the navigation signals and driving the stepper motor in response thereto.

14. The display of claim 13, comprising a plurality of indicia indicative of a plurality of navigation parameters and further comprising a microprocessor having an input coupled to receive a plurality of navigation signals and an output coupled to said stepper motor for driving said stepper motor in response to said navigation signals.

* * * * *